United States Patent
Lin et al.

(10) Patent No.: US 11,669,669 B2
(45) Date of Patent: Jun. 6, 2023

(54) CIRCUIT LAYOUTS AND RELATED METHODS

(71) Applicant: TAIWAN SEMICONDUCTOR MANUFACTURING COMPANY LTD., Hsinchu (TW)

(72) Inventors: Chin-Shen Lin, Taipei (TW); Wan-Yu Lo, Taoyuan County (TW); Shao-Huan Wang, Taichung (TW); Kuo-Nan Yang, Hsinchu (TW); Chung-Hsing Wang, Hsinchu County (TW); Sheng-Hsiung Chen, Hsinchu County (TW); Huang-Yu Chen, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 96 days.

(21) Appl. No.: 16/943,827

(22) Filed: Jul. 30, 2020

(65) Prior Publication Data

US 2022/0035982 A1     Feb. 3, 2022

(51) Int. Cl.
     *G06F 30/30*          (2020.01)
     *G06F 30/392*        (2020.01)
     *G06F 30/347*        (2020.01)
     *H01L 21/78*         (2006.01)

(52) U.S. Cl.
CPC .......... *G06F 30/392* (2020.01); *G06F 30/347* (2020.01); *H01L 21/78* (2013.01)

(58) Field of Classification Search
CPC ..... G06F 30/392; G06F 30/347; H01L 21/78; H01L 22/12; H01L 27/10
USPC ........................................................ 716/119
See application file for complete search history.

(56) References Cited

U.S. PATENT DOCUMENTS 6,973,634 B1 * 12/2005 Teig ...................... H01L 23/528
                                                         257/E23.151

* cited by examiner

*Primary Examiner* — Jack Chiang
*Assistant Examiner* — Brandon Bowers
(74) *Attorney, Agent, or Firm* — WPAT Law; Anthony King (57) ABSTRACT

A method for manufacturing a semiconductor device is provided. The method comprises determining a dimensional quantity of a layout pattern having an angle relative to grid lines of a minimum grid. The minimum grid may be defined by a first quantity associated with a first direction and a second quantity associated with a second direction perpendicular to the first direction. The determination of the dimensional quantity of the layout pattern is based on the first quantity, the second quantity and the angle of the layout pattern relative to the grid lines of the minimum grid.

20 Claims, 7 Drawing Sheets

CIRCUIT LAYOUTS AND RELATED METHODS

CROSS REFERENCE TO RELATED APPLICATIONS

This application is related to applicant's previously filed U.S. application Ser. No. 16/911,343, filed Jun. 24, 2020, which is herein incorporated by reference.

BACKGROUND

An integrated circuit ("IC") includes one or more devices made of semiconductors and other appropriate materials. One way in which to represent a semiconductor device is with a plan view diagram referred to as a layout diagram. A layout diagram is hierarchical and is decomposed into modules which carry out higher-level functions as required by the IC's design specifications.

As technology progresses, the minimum size of the circuit element that can be manufactured in an IC continues to reduce. Hence, there is an ever-increasing demand for increasing the number of circuit elements in an IC of the same or smaller size.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

BRIEF DESCRIPTION OF THE DRAWINGS

Aspects of the present disclosure are best understood from the following detailed description when read with the accompanying figures. It is emphasized that, in accordance with the standard practice in the industry, various features may be not drawn to scale. In fact, the dimensions of the various features may be arbitrarily increased or reduced for clarity of discussion.

DETAILED DESCRIPTION OF THE DISCLOSURE

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The element(s) or feature(s) may be otherwise oriented (rotated 90° or at other orientations) and the spatially relative descriptors used herein may likewise be interpreted accordingly.

It should be understood that in the present disclosure, one pattern/layer/structure/surface/direction being substantially parallel to another pattern/layer/structure/surface/direction means that the two patterns/layers/structures/surfaces/directions are parallel to each other, or the two patterns/layers/structures/surfaces/directions are intended to be configured to be parallel to each other but may not be perfectly parallel to each other due to design, manufacturing, measurement errors/margins caused by non-ideal manufacturing and measurement conditions. Such a description should be recognizable to one of ordinary skill in the art.

It should be understood that in the present disclosure, one pattern/layer/structure/surface/direction being substantially perpendicular to another pattern/layer/structure/surface/direction means that the two patterns/layers/strictures/surfaces/directions are perpendicular to each other, or the two patterns/layers/structures/surfaces/directions are intended to be configured to be perpendicular to each other but may not be perfectly perpendicular to each other due to design, manufacturing, measurement errors/margins caused by non-ideal manufacturing and measurement conditions. Such a description should be recognizable to one of ordinary skill in the art.

In the present disclosure, two layers/patterns/structures being formed on a same level means that the two layers/patterns/structures have a same distance from a reference plane, for example, a surface of a substrate, based on which a semiconductor device is formed, or the two layers/patterns/structures are intended to be configured to have a same distance from a reference plane, for example, a surface of a substrate, based on which a semiconductor device is formed but may not perfectly maintain the same distance from the reference plane due to design, manufacturing, measurement errors/margins caused by non-ideal manufacturing and measurement conditions. Such a description should be recognizable to one of ordinary skill in the art.

In the present disclosure, two layers/patterns/structures being formed on different levels means that with consideration of variations/errors caused by, for example, surface roughness, the two layers/patters/structures have different distances from a reference plane, for example, a surface of a substrate, based on which a semiconductor device is formed.

In the present disclosure, a layer, a pattern, or a structure extending in one direction means that a dimension of the layer, the pattern, or the structure in the extended direction is greater than another dimension of the layer, the pattern, or the structure in another dimension substantially perpendicular to the extended direction.

In the present disclosure, "about" or "approximately" used to describe a value of a parameter means that the parameter is equal to the described value or that the parameter is within a certain range of the described value, when design error/margin, manufacturing error/margin, measurement error etc. are considered. Such a description should be recognizable to one of ordinary skill in the art.

Any of the embodiments described herein may be used alone or together with one another in any combination. The one or more implementations encompassed within this specification may also include embodiments that are only partially mentioned or alluded to or are not mentioned or alluded to at all in this brief summary or in the abstract. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

In the present disclosure, not every layer of a cell or a layout is depicted in the drawings. One of ordinary skill in the art should understand that the cell or the layout can include more layers to implement functionality of the cell and these layers are omitted merely for convenience of description.

Integrated circuits are usually made of semiconductor devices and conductive interconnections. An integrated circuit usually comprises several layers. Each layer comprises various circuit elements, devices and wires. Different layers can be connected by interconnections such as vias.

In current manufacturing technologies, each layer is made with a plurality of steps based on photolithographic techniques. In each step, a pattern is formed on a mask. The pattern may also be referred to as a layout pattern. With the aid of techniques such as photoresists and optical projection, the pattern can be transferred to a semiconductor wafer to form structures with the electrical characteristics for which the structures are designed. Such structures can be referred to as featured structures.

Featured structures may vary in material. Examples include semiconductors, doped semiconductors, insulators such as oxides, conductive materials such as metal (with copper and aluminum being common examples), treatment materials such as silicides, more advanced materials such as tungsten and low-K materials, and other materials that may be appropriate.

Featured structures may vary in size, and several structures may together form a larger featured structure that has certain electrical characteristics, in which case the larger featured structure can be referred to as a circuit element or device. For example, doped P-type and N-type wells can be formed on a semiconductor substrate (wafer). Strips of thin oxides and blocks of metal contacts may also be formed. The aforementioned structures may form a transistor, one of the most common semiconductor devices.

Other types of featured structures exist, such as conductive tracks that electrically connect one or more featured structures, one or more circuit elements, or any combination of them. Conductive tracks may also serve to distribute electrical power, reference voltages (such as VDD and VSS) and clock.

Multiple circuit elements can together form a semiconductor device, sometimes referred to as a semiconductor die or simply a die. On a given wafer, many semiconductor dice can be made concurrently. These dice can be cut, or singulated, to form semiconductor devices each of which is individually functional. When properly packaged and tested, the manufactured semiconductor devices can be highly valuable.

Figure 1:
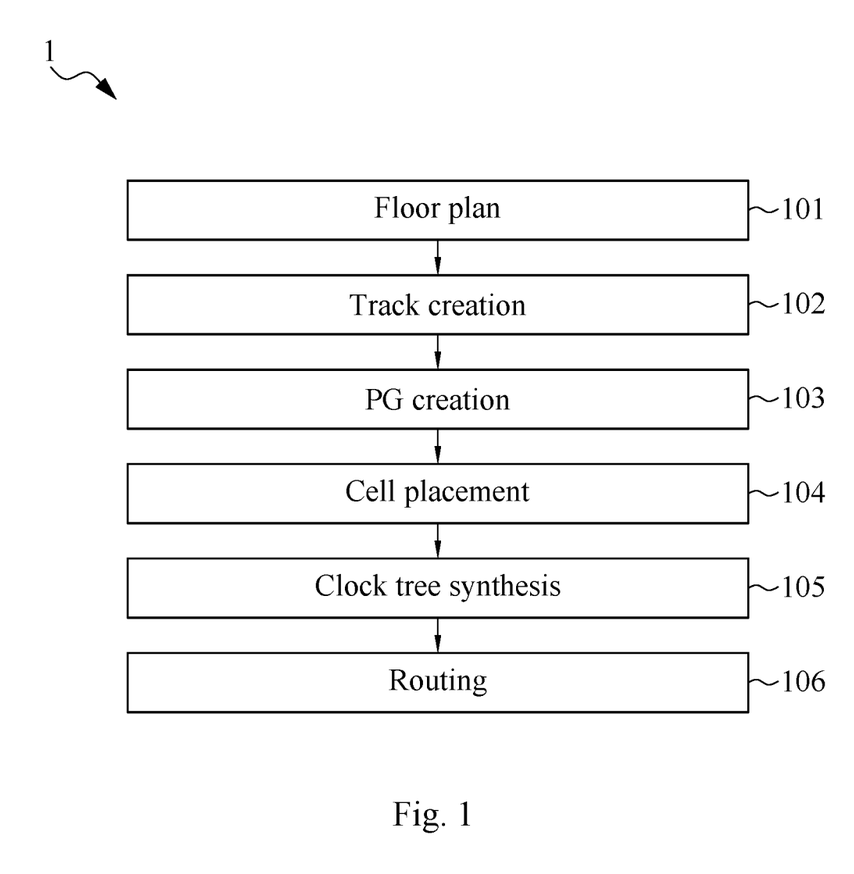
FIG. 1 is a flowchart of a method for manufacturing a semiconductor device in accordance with some embodiments of the present disclosure.

FIG. 1 is a flowchart 1 of a method for manufacturing a semiconductor device in accordance with some embodiments of the present disclosure. The flowchart 1 includes steps for placement and routing (PnR) for design implementation.

In step 101, a floor plan is created. Since each layer in an integrated circuit can include many different circuit devices, whose locations therefore have to be planned. In step 102, tracks are created. As mentioned, tracks can be used to electrically connect various circuit elements.

In step 103, power grids are created. Integrated circuits require electric power to operate. Different circuit blocks may operate at different voltage levels. Hence, power grids providing different voltage levels are created. Power grids may also be used to distribute the ground potential, which may be regarded as another reference voltage.

In step 104, cells are disposed or placed. A cell comprises a determined number of circuit elements that together possess certain electrical characteristics and functions. Functional circuit blocks can be provided in cells, each of which may then be interconnected to form a larger circuit block or a larger cell. Semiconductor foundries may provide to circuit designers libraries of circuit cells that implement widely used functions such as basic logic gates (such as AND, OR, NOT, NAND and NOR), basic memory cells (such as various types of SRAM and DRAM) and basic digital circuits (such as inverters and flip-flops).

In step 105, clock tree synthesis is performed. Clock timing is important for the correct operation of digital circuits, so the circuit designer also has to take care of clock distribution. In step 106, routing is performed to connect the individual circuit elements.

As mentioned, one of the steps involved in semiconductor circuit manufacturing is the (photolithographic) transferal of a pattern to the wafer that is subject to the manufacturing process. Modern manufacturing technologies can produce very small patterns, thereby enabling a large computational and/or storage capacity in a small die. The patterns can be at the scale of nanometers. Therefore, the location of each of the patterns in each of the layers has to be carefully defined during the circuit design stage, and the manufacturing process carefully controlled to ensure accuracy in the placement of the patterns.

Layout patterns cannot be arbitrarily placed. Many rules govern the relative spacing of the layout patterns in order to ensure the patterns can be accurately transferred to the wafer during manufacturing. These are often referred to as design rules. Circuit designers must follow the design rules when designing circuits.

To facilitate compliance with design rules, semiconductor manufacturers (often referred to as foundries) define a minimum manufacturing grid on which layout patterns may be placed. The minimum manufacturing grid may be referred to as the minimum grid, or simply "the grid."

Foundries usually provide the minimum grid for a specific manufacturing process to the providers of electronic design automation (EDA) tools. The EDA tools will use the manufacturing grid provided by foundries as the minimum grid in their database by way of certain file formats, such as technology techfile. A given minimum grid usually indicates the manufacturing process capability of the foundry providing that minimum grid.

Figure 2A:
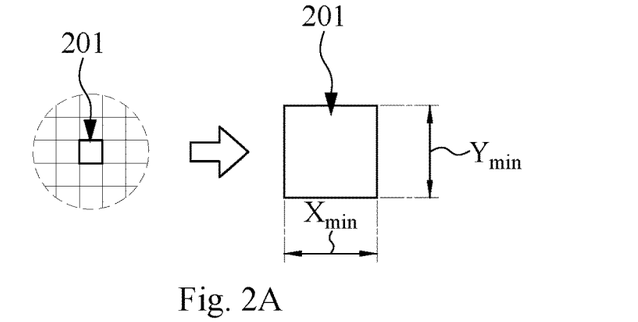
FIG. 2A illustrates a portion of a grid, in accordance with some embodiments of the present disclosure.

FIG. 2A illustrates a portion of a grid, in accordance with some embodiments of the present disclosure. The grid includes many units, or divisions, as shown in the left-hand side of FIG. 2A. One of the divisions 201 is enlarged, as shown in the right-hand side of FIG. 2A.

The grid can be defined by the size of its division. The division is a rectangle. The length in the horizontal direction is indicated as $X_{min}$; that in the vertical direction is indicated as $Y_{min}$. In the embodiment of FIG. 2A, the division 201 is a square, so $X_{min}$ is equal to $Y_{min}$; the division being a square is, however, not a limitation to the present disclosure. In an embodiment, $X_{min}$ is 1 nm and $Y_{min}$ is also 1 nm other numerical examples include $(X_{min}, Y_{min})$=(0.5 nm, 0.5 nm), (2 nm, 2 nm) and other combinations of values appropriate for the manufacturing process of concern. The values of $X_{min}$ and $Y_{min}$ may be determined by the process capability of the foundry. In an embodiment, the values of $X_{min}$ and $Y_{min}$ may be equal to or slightly smaller than the minimum circuit feature size that is feasible under a given manufacturing process.

Usually, foundries prefer that circuit designers place their layout patterns on the minimum grid to ensure manufacturing quality. In the context of the present disclosure, a pattern is "on-grid" if the corners of the pattern are on the intersections of the grid lines. For example, a rectangular conductive line is on-grid if all four corners are placed aligned with the grid line intersections. In an embodiment, there is an additional requirement for a via to be considered as on-grid: not only are the four corners of the via aligned with the grid line intersections, but also the center of the via.

Figure 2B:
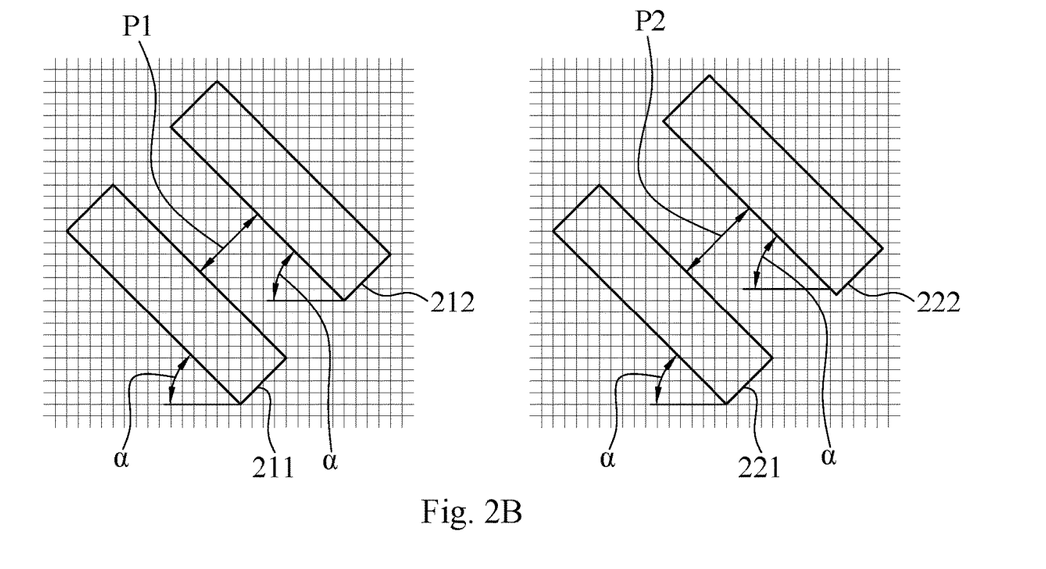
FIGS. 2B and 2C illustrate several layout patterns on a grid, in accordance with some embodiments of the present disclosure.

FIG. 2B illustrates exemplary layout patterns on a minimum grid, in accordance with some embodiments of the present disclosure. Patterns 211 and 212 are considered on-grid because all the corners of the patterns are on the grid line intersections. Similarly, pattern 221 is also on-grid. Pattern 222, however, is off-grid since not all of its four corners are aligned with grid line intersections; in fact, in the particular example of pattern 222, all four corners are placed within a division and thus fail to be aligned with the grid line intersections.

Figure 2C:
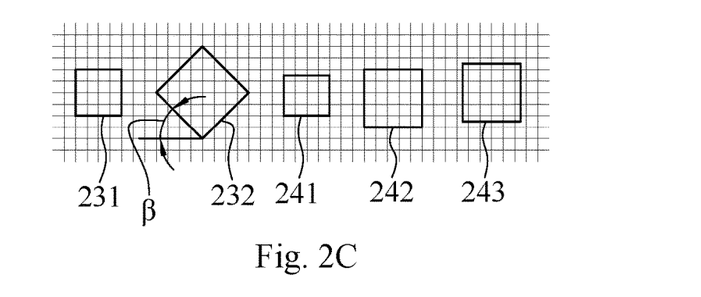

FIG. 2C illustrates other exemplary layout patterns on a minimum grid, in accordance with some embodiments of the present disclosure.

Patterns 231, 232, 241, 242, and 243 are all vias. Pattern 231 is on-grid because its four corners as well as its center align with grid line intersections. Similarly, via pattern 232 is also considered on-grid, despite a 45° rotation relative to pattern 231. In contrast, patterns 241, 242, and 243 are all considered off-gird. Two corners of via pattern 241 fail to align with the grid line intersections. The center of via pattern 242 lies within a division. The four corners of via pattern 243 fail to align with the grid line intersections, despite its center being so located.

In an embodiment, the minimum grid is the same throughout different layers of a given wafer, even though the critical size and the process cost may differ in different layers. In an embodiment, the grid varies for different layers because of, e.g., cost concerns.

In comparative embodiments, patterns available to circuit designers are those having some, most or all of their sides substantially in parallel with the grid lines. Examples include rectangular or elongated patterns that are placed horizontally or vertically. Pattern 231 is an example of this type: its sides coincide with the grid lines. An advantage of these comparative embodiments is that the relative ease of visually verifying on-grid/off-grid conditions and visually assessing relative distances among the layout patterns. For example, the distance between patterns 241 and 242 is clearly three divisions. A disadvantage of these comparative embodiments, however, is inflexibility: since the orientation of patterns is limited, surface area usage might be suboptimally efficient.

To provide more flexibility, patterns with an angle relative to the grid lines may be provided to circuit designers. In an embodiment, the angle may be an oblique angle. In an embodiment, the angle may be less than 180°. In an embodiment, the angle may be less than 90°. In an embodiment, the angle may be such that if a right triangle has such an angle, then the length of each of the two legs is a rational number. In an embodiment, the angle may be such that if a right triangle has such an angle, then the length of each of the two legs is an integer (such as 1, 2, 3 etc. nanometers). In an embodiment, the angle may be substantially 45°. A substantially 45° angle may be preferred in same embodiments. In an embodiment, it is said that the patterns may have an oblique angle.

Referring back to FIG. 2B, the patterns 211, 212, 221, and 222 all have an angle α of substantially 45° relative to the grid lines. Note that the amount of 45° is exemplary not limiting. Note also that each pattern may have different angles of inclination.

The pattern 232 in FIG. 2C is another example of a pattern with an angle β of substantially 45° relative to the grid lines. In some embodiments, such patterns may be called "rotated patterns" or "diagonal patterns."

Rotated patterns offer more flexibility to circuit designers in laying out various circuit patterns. However, one problem that may arise is the accuracy in controlling the spacing between the rotated patterns.

Refer again to FIG. 2B. Assume that in FIG. 2B, $X_{min}$ and $Y_{min}$ are equal and denoted as D (say, 0.5 nm). Patterns 211 and 212 are diagonal patterns at 45°. The distance (or spacing) between patterns 211 and 212 is P1, five times the length of the diagonal line of the grid division. That is, P1 equals $5*2^{(1/2)}*D$. This example demonstrates that even though D may be an integer or rational number, the distance between two on-grid rotated patterns can be irrational numbers. This could be problematic because the spacing between layout patterns is usually defined as rational numbers design rules, for example).

Patterns 221 and 222, with spacing P2, on the right-hand side of FIG. 2B are another example. Compared to pattern 212 on the left-hand side of FIG. 2B, pattern 222 is shifted toward the upper-right. The amount of shift can be chosen so that the distance P2 is a rational number or an integer in order to be compliant with design rules. However, pattern 222 is off-grid, which is usually not allowed. To make pattern 222 on-grid, an offset can be added to the spacing required by the design rules. However, it may not be easy to precisely control the offset. Moreover, the offset can even be random, considering that an effort is made here to adjust an irrational number to a rational one.

Imprecise or random distance among the patterns can be problematic. If the amount of spacing does not conform exactly to the intended design, manufacturing issues can arise, such as violation of design rules, overlay issues in lithography, and undesirable etching results.

The present disclosure also provides methods that maintain the flexibility of diagonal patterns while providing more precise control of dimensional quantities in the layout patterns. The dimensional quantities can be spacing and distance between patterns, but can also be length, width, and size of individual patterns. In other words, embodiments of the present disclosure enable patterns and tracks with a given pitch to be on-grid.

In accordance with some embodiments of the present disclosure, a method for manufacturing a semiconductor device is provided. A layout pattern is provided and has an angle relative to grid lines of a minimum grid. The minimum grid may be defined by a first quantity and a second quantity. The first quantity may be associated with a first direction or a first axis, such as in an X-axis orientation. The second quantity may be associated with a second direction or a second axis. The second direction or axis may be perpendicular to the first direction or axis; that is, the second direction or axis may be in a Y-axis orientation. A dimensional quantity of the layout pattern is determined based on the first quantity, the second quantity and the angle.

By taking the first quantity, the second quantity, and the angle into consideration when determining the dimensional quantity, circuit designers can employ rotated layout patterns with accurate placement and ensure that the employed patterns stay on-grid. Accuracy in placement contributes to a higher manufacturing yield. Preventing the employed patterns from being off-grid reduces errors.

Figure 3A:
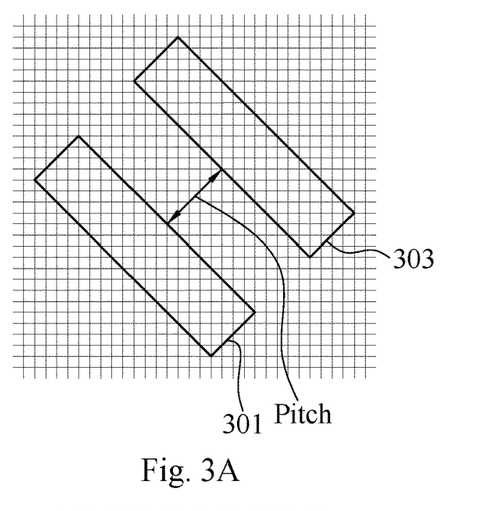
FIGS. 3A-3C illustrate several layout patterns on a grid and the distance relationships between different layout patterns, in accordance with some embodiments of the present disclosure.

To better appreciate the advantages of the present disclosure, refer to FIG. 3A, which illustrates an embodiment of the present disclosure.

In FIG. 3A, two elongated patterns 301 and 303 are disposed, with the distance therebetween denoted as Pitch. As persons skilled in the art can recognize, the term "pitch" often describes the required distance between neighboring layout patterns. The patterns 301 and 303 are rotated by 45° relative to the grid lines.

Assuming that in FIG. 3A, the grid divisions are squares with the length of one side being D (that is, $X_{min}=Y_{min}=D$), in contrast to some comparative embodiments, in which the required spacing between two neighboring patterns is set to an integer or an integer multiple of the grid size, the required amount of Pitch in the embodiment of FIG. 3A is set to the square root of two multiplied by a number M, where M is an integer multiple of $X_{min}$ and) $Y_{min}$. The amount of the square root of two is determined in view of the substantially 45° angle of the patterns 301 and 303.

By setting the required pitch to the square root of two multiplied by an integer multiple of $X_{min}$ and $Y_{min}$ (both equal to 1) in this embodiment), the distance between the patterns 301 and 303 that are actually transferred (lithographically, for example) to the wafer would substantially precisely follow the required pitch that has been set. As such, the spacing between the manufactured patterns can be controlled more precisely, and little (if any) random offset in spacing will occur.

The factor of the square root of two is determined based on the fact that $X_{min}=Y_{min}=D$ and the angle of inclination is 45°. Other factors are possible. For example, if $X_{min}=Y_{min}$ D and the angle of inclination θ is about 36.8699°, then the Pitch can be determined such that (Pitch*cos θ) is an integer multiple of $X_{min}$ and that (Pitch*sin θ) is an integer multiple of $Y_{min}$.

The inventive concept behind the embodiments can be expanded to patterns that are not rectangles or elongated, such as rotated vias or L-shaped patterns. For example, if the size of a square via with a 45° rotation is set to the square root of two multiplied by four times D, as in the pattern 232 in FIG. 2C, then the rotated via can become on-grid. Rotated vias may be particularly useful in combination with rotated conductive tracks.

Note that the combination of patterns 301 and 303 in FIG. 3A can be considered one layout pattern, in which case the Pitch can be considered a dimensional quantity of the layout pattern and the patterns 301 and 303 can be considered two sub-patterns.

The inventive concept can be applied to circumstances that are not integrated circuit layouts. It can be applied to other circumstances such as printed circuit board (PCB) layout patterns, and a field-programmable gate array (FPGA) layout patterns.

Figure 3B:
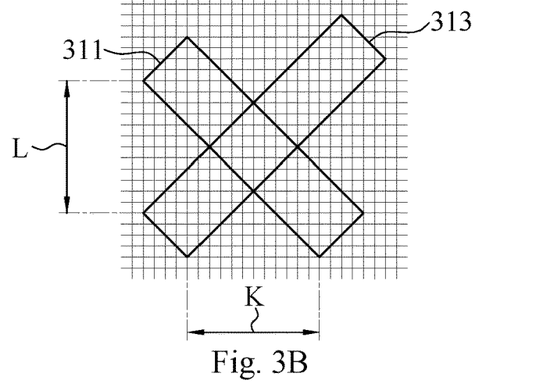

FIG. 3B illustrates another embodiment of the present disclosure. In contrast to FIG. 3A, patterns 311 and 313 are disposed in different layers. When viewed from above, the patterns 311 and 313 cross each other, although this crossing does not automatically imply that they are physically in contact. There may exist electrical interconnects (such as vias) between patterns 311 and 313.

When viewed from above, there are two "distances" K and L between patterns 311 and 313, as indicated in FIG. 3B. In other words, sub-patterns 311 and 313 may form a layout pattern with K and L being two dimensional quantities. As seen in FIG. 3B, K indicates the distance along the X-axis orientation between the two patterns, and L indicates that along the Y-axis orientation.

In an embodiment. K may be set to an even-integer multiple of $X_{min}$. In an embodiment, L may be set to an even-integer multiple of $Y_{min}$. In addition to placing rotated patterns on-grid, the even-integer-multiple factor may provide other benefits such as helping other patterns in the same or other layers to meet design rules, to be on-grid, or both.

For example, if K and L are set to an odd-integer multiple of $X_{min}$ and $Y_{min}$, respectively, then it might be problematic to place an element between the patterns with equal distance to both patterns. In this situation, moreover, a via that connects the patterns 311 and 313 in different layers may be off-grid.

Figure 3C:
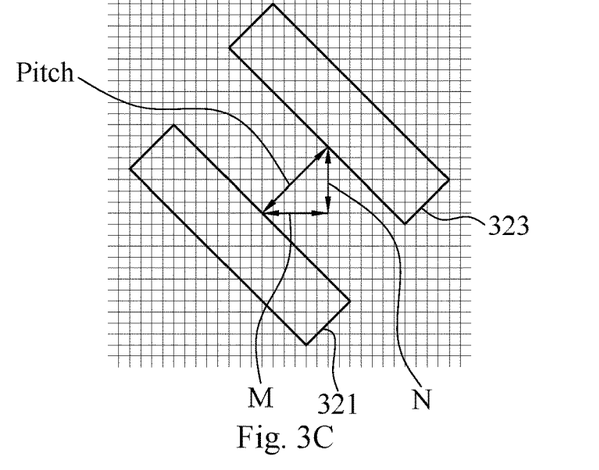

FIG. 3C illustrates another embodiment of the present disclosure. The spacing Pitch between patterns 321 and 323 can be regarded as having two components M and N. M can be viewed as the component of Pitch along the first direction or axis of the grid (e.g., along the X-axis orientation or horizontal); N, along the second direction or axis of the grid (e.g., along the Y-axis orientation or vertical). M and N may be calculated by projecting Pitch onto the first and second direction or axes of the grid, respectively.

In the embodiment of FIG. 3C, M, N or both may be set to an even-integer multiple of the grid size D. In this embodiment, another element or pattern may exist in the center between patterns 321 and 323 that is also on-grid.

Figure 3D:
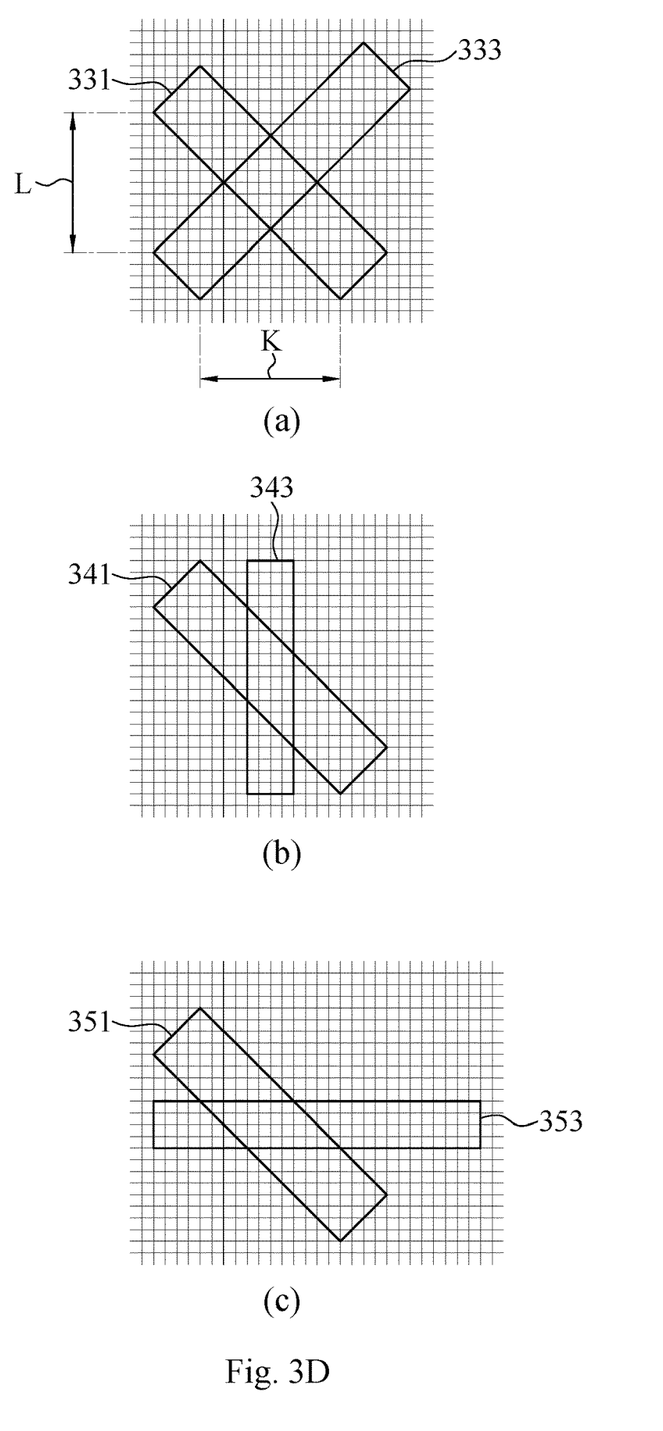
FIG. 3D illustrates several layout patterns on a grid, in accordance with some embodiments of the present disclosure.

One of the benefits of the embodiments of the present disclosure is that various rotated patterns can be manufactured on-grid. FIG. 3D illustrates more patterns that can be made on-grid. Two rotated sub-patterns may cross each other when viewed from above, as illustrated in patterns 331 and 333 in part (a). One sub-pattern may be rotated and the other stay vertical, as illustrated in patterns 341 and 343 in part (b), or one sub-pattern may be rotated and the other stay horizontal, as illustrated in patterns 351 and 353 in part (c).

Note that in the examples shown in parts (a), (b) and (c) of FIG. 3D, the two sub-patterns may exist in the same or different layers. Putting the two sub-patterns in different layers may improve manufacturing yield.

Figure 4:
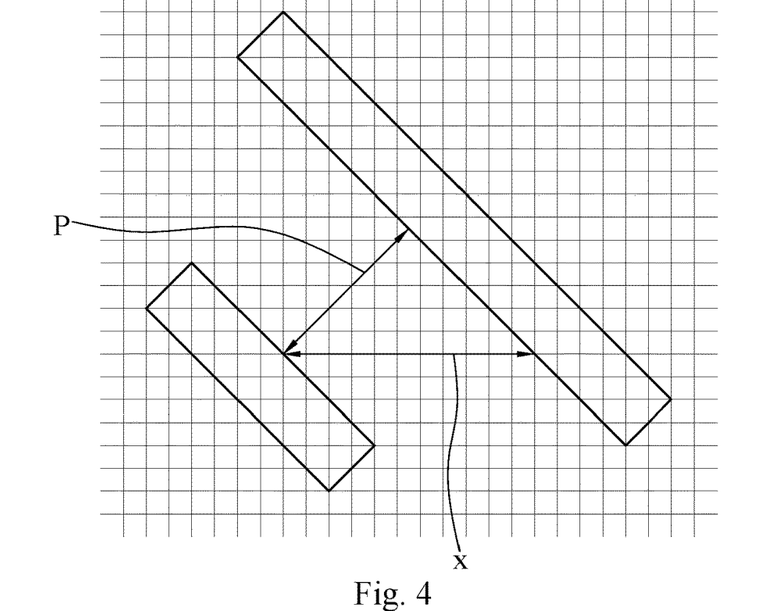
FIGS. 4 and 5 both illustrate several layout patterns on a grid, in accordance with some embodiments of the present disclosure.

A numerical example is given as follows, with reference to FIG. 4. Note that for clarity, the grid drawn in FIG. 4 is much coarser than the numerical values below may indicate.

Assuming that $X_{min}$ and $Y_{min}$ are each 1 nm and that the two rectangular patterns have a 45° rotation, if the circuit designer wants to have a pitch P between the two patterns that is close to 100 nm, the technical question is how to determine the value of pitch P such that the two patterns are on-grid.

Following the inventive concept of the embodiments of the present disclosure, we first find that the horizontal distance x is 100*2^(½)/1 nm=about 141.4. This number can be rounded to integer 141 or 142. If the designer can choose 142, then the pitch P is set to 142/(2^(½)), which is equal to about 100.4091629. This value can be set in the techfile for EDA tool implementation. More digits can be used to arrive at the desired accuracy. By setting the pitch P this way, the resulting patterns will be on-grid.

In the embodiments discussed, the distance between neighboring (sub-)patterns that is to be determined by the circuit designer for good manufacturability is measured along an axis inclined relative to the grid axes. The angle of the inclination is usually related to the amount of inclination of the (sub-)patterns concerned.

In another embodiment of the present disclosure, the required spacing (or pitch) between neighboring (sub-)patterns is defined not by one quantity but by two quantities, each of the two quantities being determined or measured along the grid axes. This embodiment has the advantage of being EDA friendly because it is natural for the EDA to process distance quantities along X and Y axes. In other words, Cartesian coordinates (e.g., (X,Y)) are easier for the EDA to process than polar (e.g., (r, θ)) coordinates.

Figure 5:
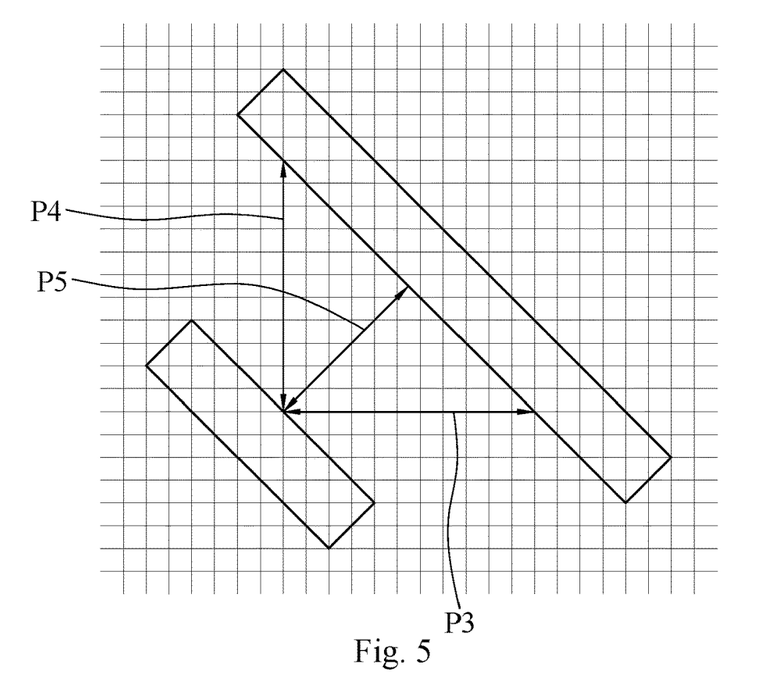

Referring to FIG. 5, when circuit designers want to set the spacing between the two elongated patterns, instead of trying to set distance P5 (measured in an oblique direction), they may set distances P3 (i.e., along the horizontal grid axis) and P4 (i.e., along the vertical grid axis).

If the distance P5 has to exceed a certain amount (in order to e.g., comply with the design rules), given the angle of inclination θ, trigonometric calculation and the inventive concept discussed previously in detail, the distances P3 and P4 can be determined such that P5 complies with the design rules while the two (sub-)patterns are kept on-grid.

Figure 6:
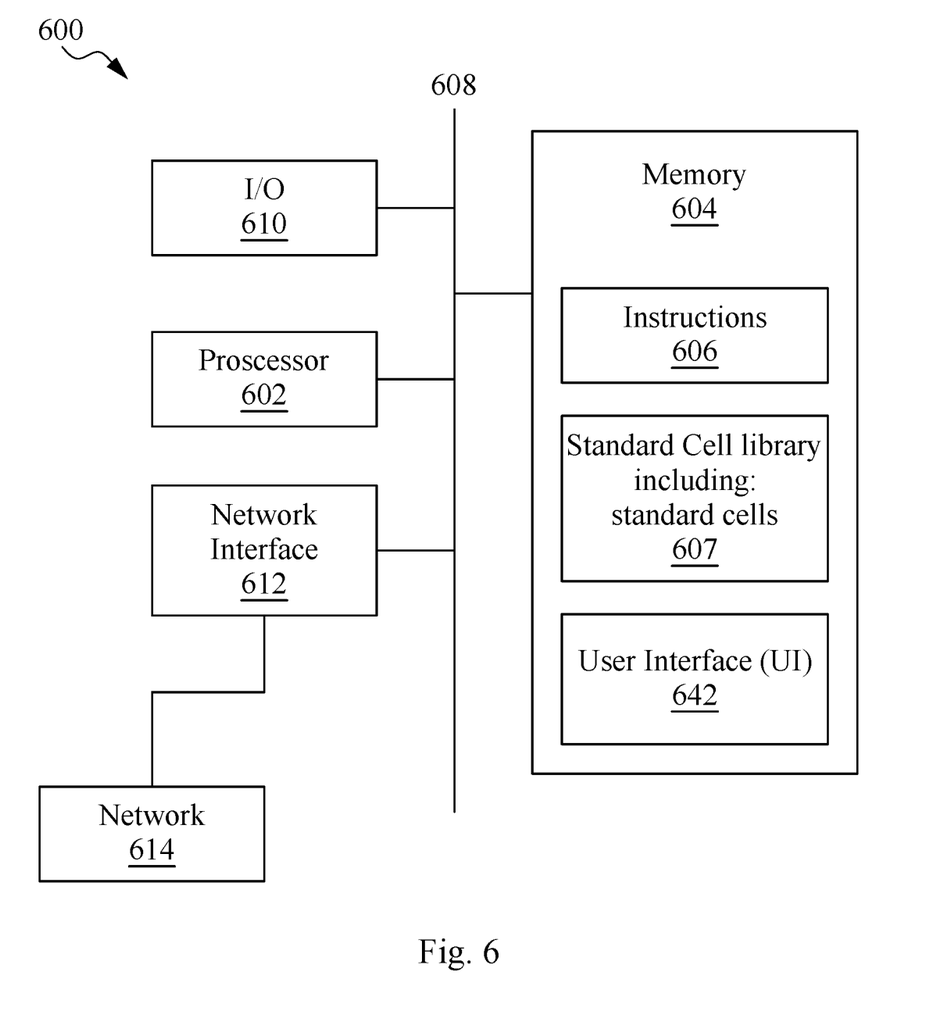
FIG. 6 is a block diagram of an electronic design automation (FDA) system, in accordance with some embodiments.

FIG. 6 is a block diagram of an electronic design automation (EDA) system 600, in accordance with some embodiments.

In some embodiments, EDA system 600 includes an APR system. Methods described herein of generating PG layout diagrams, in accordance with one or more embodiments, are implementable, for example, using EDA system 600, in accordance with some embodiments.

In some embodiments, EDA system 600 is a general purpose computing device including a hardware processor 602 and a non-transitory, computer-readable storage medium 604. Storage medium 604, amongst other things, is encoded with, i.e., stores, computer program code 606, i.e., a set of executable instructions. Execution of instructions 606 by hardware processor 602 represents (at least in part) an EDA tool which implements a portion or all of, e.g., the methods described herein in accordance with one or more (hereinafter, the noted processes and/or methods).

Processor 602 is electrically coupled to computer-readable storage medium 604 via a bus 608. Processor 602 is also electrically coupled to an I/O interface 610 by bus 608. A network interface 612 is also electrically connected to processor 602 via bus 608. Network interface 612 is connected to a network 614, so that processor 602 and computer-readable storage medium 604 are capable of connecting to external elements via network 614. Processor 602 is configured to execute computer program code 606 encoded in computer-readable storage medium 604 in order to cause system 600 to be usable for performing a portion or all of the noted processes and/or methods. In one or more embodiments, processor 602 is a central processing unit (CPU), a multi-processor, a distributed processing system, an application specific integrated circuit (ASIC), and/or a suitable processing unit.

In one or more embodiments, computer-readable storage medium 604 is an electronic, magnetic, optical, electromagnetic, infrared, and/or a semiconductor system (or apparatus or device). For example, computer-readable storage medium 604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 604 includes a compact disk-read only memory (CD-ROM), a compact disk-read/write (CD-RANT), and/or a digital video disc (DVD).

In one or more embodiments, storage medium 604 stores computer program code 606 configured to cause system 600 (where such execution represents (at least in part) the EDA tool) to be usable for performing a portion or all of the noted processes and/or methods. In one or more embodiments, storage medium 604 also stores information which facilitates performing a portion or all of the noted processes and/or methods. In one or more embodiments, storage medium 604 stores library 607 of standard cells including such standard cells as disclosed herein.

EDA system 600 includes I/O interface 610. I/O interface 610 is coupled to external circuitry. In one or more embodiments, I/O interface 610 includes a keyboard, keypad, mouse, trackball, trackpad, touchscreen, and/or cursor direction keys for communicating information and commands to processor 602.

EDA system 600 also includes network interface 612 coupled to processor 602. Network interface 612 allows system 600 to communicate with network 614, to which one or more other computer systems are connected. Network interface 612 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 600.

System 600 is configured to receive information through I/O interface 610. The information received through I/O interface 610 includes one or more of instructions, data, design rules, libraries of standard cells, and/or other parameters for processing by processor 602. The information is transferred to processor 602 via bus 608. FDA system 600 is configured to receive information related to a UI through I/O interface 610. The information is stored in computer-readable medium 604 as user interface (UI) 642.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 600. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 7:
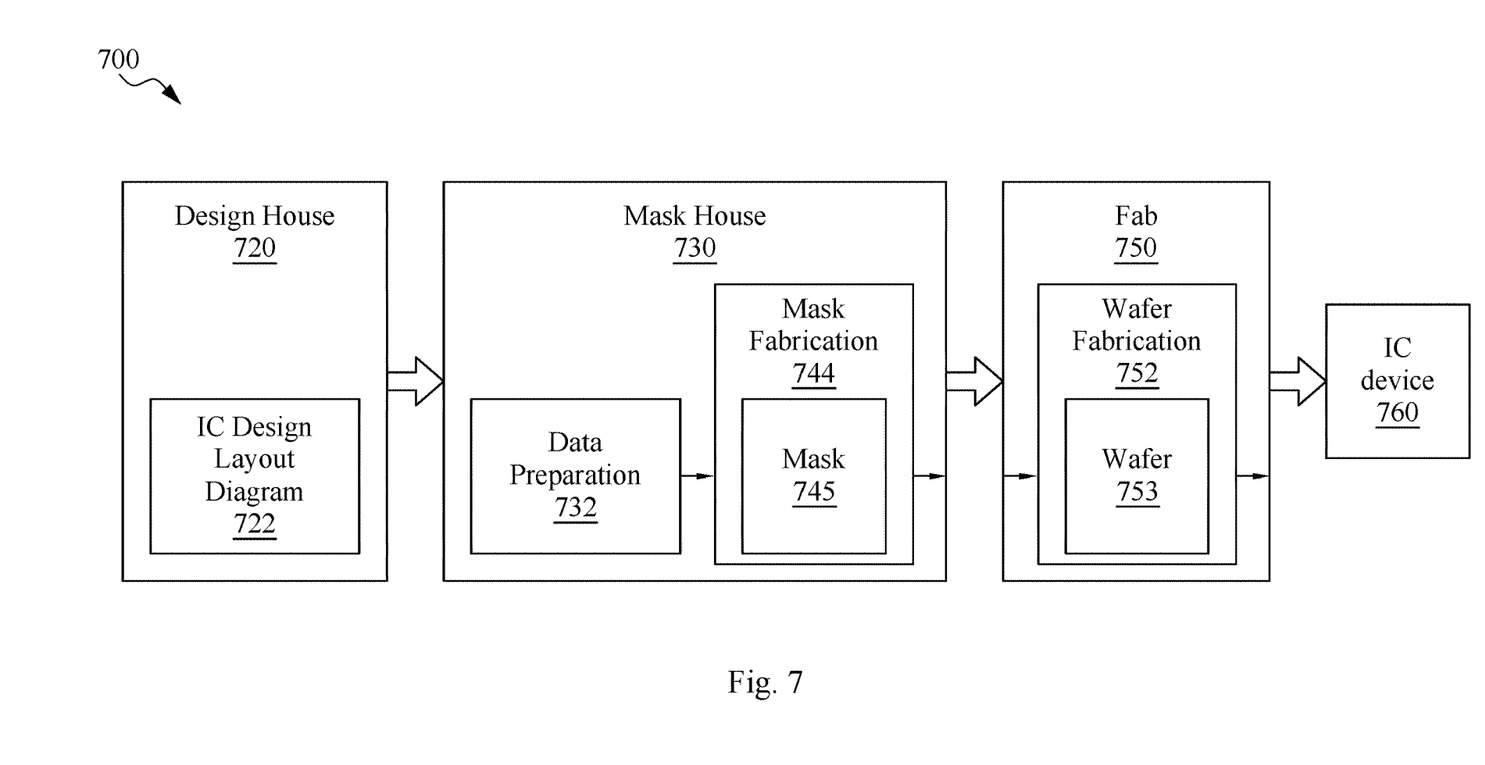
FIG. 7 is a block diagram of an integrated circuit (IC) manufacturing system, and an IC manufacturing flow associated therewith, in accordance with some embodiments.

FIG. 7 is a block diagram of an integrated circuit (IC) manufacturing system 700, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 700.

In FIG. 7, IC manufacturing system 700 includes entities, such as a design house 720, a mask house 730, and an IC manufacturer/fabricator ("fab") 750, that interact with one another in the design, development, and manufacturing cycles and/or services related to manufacturing an IC device 760. The entities in system 700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 720, mask house 730, and IC fab 750 is owned by a single larger company. In some embodiments, two or more of design house 720, mask house 730, and IC fab 750 coexist in a common facility and use common resources.

Design house (or design team) 720 generates an IC design layout diagram 722. IC design layout diagram 722 includes various geometrical patterns designed for an IC device 760. The geometrical patterns correspond to patterns of metal, oxide, or semiconductor layers that make up the various components of IC device 760 to be fabricated. The various layers combine to form various IC features. For example, a portion of IC design layout diagram 722 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 720 implements a proper design procedure to form IC design layout diagram 722. The design procedure includes one or more of logic design, physical design or place and route. IC design layout diagram 722 is presented in one or more data files having information of the geometrical patterns. For example, IC design layout diagram 722 can be expressed in a GDSII file format or DFII file format.

Mask house 730 includes data preparation 732 and mask fabrication 744. Mask house 730 uses IC design layout diagram 722 to manufacture one or more masks 745 to be used for fabricating the various layers of IC device 760 according to IC design layout diagram 722. Mask house 730 performs mask data preparation 732, where IC design layout diagram 722 is translated into a representative data file ("RDF"). Mask data preparation 732 provides the RDF to mask fabrication 744. Mask fabrication 744 includes a mask writer. A mask writer converts the RDF to an image on a substrate, such as a mask (reticle) 745 or a semiconductor wafer 753. The design layout diagram 722 is manipulated by mask data preparation 732 to comply with particular characteristics of the mask writer and/or requirements of IC fab 750. In FIG. 7, mask data preparation 732 and mask fabrication 744 are illustrated as separate elements. In some embodiments, mask data preparation 732 and mask fabrication 744 can be collectively referred to as mask data preparation.

In some embodiments, mask data preparation 732 includes optical proximity correction (OPC) which uses lithography enhancement techniques to compensate for image errors, such as those that can arise from diffraction, interference, other process effects and the like. OPC adjusts IC design layout diagram 722. In some embodiments, mask data preparation 732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 732 includes a mask rule checker (MRC) that checks the IC design layout diagram 722 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 722 to compensate for limitations during mask fabrication 744, which may undo part of the modifications performed by OPC in order to meet mask creation rules.

In some embodiments, mask data preparation 732 includes lithography process checking (LPC) that simulates processing that will be implemented by IC fab 750 to fabricate IC device 760. LPC simulates this processing based on IC design layout diagram 722 to create a simulated manufactured device, such as IC device 760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors and the like, or combinations thereof. In some embodiments, after a simulated manufactured device has been created by LPC, if the simulated device is not close enough in shape to satisfy design rules, OPC and/or MRC are be repeated to further refine IC design layout diagram 722.

It should be understood that the foregoing description of mask data preparation 732 has been simplified for the purposes of clarity. In some embodiments, data preparation 732 includes additional features such as a logic operation (LOP) to modify the IC design layout diagram 722 according to manufacturing rules. Additionally, the processes applied to IC design layout diagram 722 during data preparation 732 may be executed in a variety of different orders.

After mask data preparation 732 and during mask fabrication 744, a mask 745 or a group of masks 745 are fabricated based on the modified IC design layout diagram 722. In some embodiments, mask fabrication 744 includes performing one or more lithographic exposures based on IC design layout diagram 722. In some embodiments, an electron-beam (e-beam) or a mechanism of multiple e-beams can be used to form a pattern on a mask (photomask or reticle) 745 based on the modified IC design layout diagram 722. Mask 745 can be formed in various technologies. In some embodiments, mask 745 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 745 includes a transparent substrate (e.g., fused quartz) and an opaque material (e.g., chromium) coated in the opaque regions of the binary mask. In another example, mask 745 is formed using a phase shift technology. In a phase shift mask (PSM) version of mask 745, various features in the pattern formed on the phase shift mask are configured to have proper phase difference to enhance the resolution and imaging quality. In various examples, the phase shift mask can be attenuated PSM or alternating PSM. The mask(s) generated by mask fabrication 744 is used in a variety of processes. For example, such a mask(s) is used in an ion implantation process to form various doped regions in semiconductor wafer 753, in an etching process to form various etching regions in semiconductor wafer 753, and/or in other suitable processes.

IC fab 750 includes wafer fabrication 752. IC fab 750 is an IC fabricator that includes one or more manufacturing facilities for the fabrication of a variety of different IC products. In some embodiments, IC Fab 750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 750 uses mask(s) 745 fabricated by mask house 730 to fabricate IC device 760. Thus, IC fab 750 at least indirectly uses IC design layout diagram 722 to fabricate IC device 760. In some embodiments, semiconductor wafer 753 is fabricated by IC fab 750 using mask(s) 745 to form IC device 760. In some embodiments, the IC fabrication includes performing one or more lithographic exposures based at least indirectly on IC design layout diagram 722. Semiconductor wafer 753 includes a silicon substrate or other proper substrate having material layers formed thereon. Semiconductor wafer 753 further includes one or more of various doped regions, dielectric features, multi-level interconnects, and the like (formed at subsequent manufacturing steps).

Details regarding an integrated circuit (IC) manufacturing system (e.g., system 700 of FIG. 7), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In the present disclosure, improved methods for manufacturing semiconductor devices are disclosed. The improved methods provide the flexibility to use rotated or diagonal layout patterns and sub-patterns that are on-grid and still comply with spacing requirements that may be necessary under specific manufacturing conditions.

It will be understood that not all advantages have been necessarily discussed herein, no particular advantage is required for all embodiments or examples, and other embodiments or examples may offer different advantages.

According to an aspect of the present disclosure, a method for manufacturing a semiconductor device is provided. The method comprises determining a dimensional quantity of a layout pattern having an angle relative to grid lines of a minimum grid. The minimum grid may be defined by a first quantity associated with a first direction and a second quantity associated with a second direction perpendicular to the first direction. The determination of the dimensional quantity of the layout pattern is based on the first quantity, the second quantity and the angle of the layout pattern relative to the grid lines of the minimum grid.

In an embodiment, a portion of the layout pattern may be elongated and the dimensional quantity of the layout pattern may be a width of the elongated portion of the layout pattern. In an embodiment, the layout pattern may comprise a sub-pattern that is substantially rectangular. In an embodiment, the layout pattern may comprise a sub-pattern that is substantially L-shaped.

In an embodiment, the layout pattern may comprise a sub-pattern that is substantially an equilateral quadrilateral. In an embodiment, the sub-pattern may be a square.

According to an aspect of the present disclosure, a method for manufacturing a semiconductor device is provided. The method comprises providing a layout pattern that comprises a first sub-pattern and a second sub-pattern. The first sub-pattern and the second sub-pattern may each have an angle relative to grid lines of a minimum grid. The minimum grid may be defined by a length, a first direction and a second direction orthogonal to the first direction. The method further may comprise determining a distance between the first sub-pattern and the second sub-pattern. The distance comprises a first component associated with the first direction and a second component associated with the second direction. The step of determining is performed such that the first component is a first integer multiple of the length and the second component is a second integer multiple of the length.

According to an aspect of the present disclosure, a method for manufacturing a semiconductor device is provided. The method comprises providing a layout pattern that comprises a first sub-pattern and a second sub-pattern. The first sub-pattern and the second sub-pattern may each have an oblique angle relative to grid lines of a minimum grid. The minimum grid may be defined by a length, a first direction and a second direction orthogonal to the first direction. The method may further comprise determining a first distance and a second distance. The first distance may be between the first sub-pattern and the second sub-pattern and may be measured along the first direction. The second distance may be between the first sub-pattern and the second sub-pattern and may be measured along the second direction. The first distance and the second distance may be determined such that a third distance satisfies a design rule. The third distance may be between the first sub-pattern and the second sub-pattern and may be measured along a third direction defined by the oblique angle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for manufacturing a semiconductor device, the method comprising:
   determining a dimensional quantity of a first layout pattern having an angle relative to grid lines of a minimum grid defined by a first quantity associated with a first direction and a second quantity associated with a second direction perpendicular to the first direction based on the first quantity, the second quantity and the angle of the first layout pattern relative to the grid lines of the minimum grid, wherein the first layout pattern is associated with a first layer and has a first angle relative to the grid lines of the minimum grid;
   determining a dimensional quantity of a second layout pattern associated with a second layer different from the first layer, the second layout pattern having a second angle different from the first angle relative to the grid lines of the minimum grid;
   determining a distance in the first direction between the first layout pattern and the second layout pattern based on an even-integer multiple of the first quantity; and
   determining a distance in the second direction between the first layout pattern and the second layout pattern based on an even-integer multiple of the second quantity.

2. The method of claim 1, wherein determining the dimensional quantity of said layout pattern is based on an integer multiple of the first quantity and an integer multiple of the second quantity.

3. The method of claim 2, wherein determining the dimensional quantity of said layout pattern is based on an even-integer multiple of the first quantity and an even-integer multiple of the second quantity.

4. The method of claim 1, wherein each of the steps of determining is performed such that said layout pattern is on-grid.

5. The method of claim 4, further comprising:
   associating the first quantity and the second quantity to a design rule for manufacturing the semiconductor device.

6. The method of claim 1, further comprising:
   forming a photolithography mask corresponding to the layout pattern; and
   transferring the layout pattern to a semiconductor wafer and forming a featured structure on the semiconductor wafer.

7. The method of claim 6, further comprising:
   singulating the semiconductor wafer to form a semiconductor device.

8. The method of claim 1, wherein the layout pattern comprises a first sub-pattern and a second sub-pattern substantially parallel to the first sub-pattern, wherein the dimensional quantity of the first layout pattern comprises a pitch between the first sub-pattern and the second sub-pattern.

9. The method of claim 8, wherein the first sub-pattern is substantially rectangular, and wherein the second sub-pattern is substantially rectangular.

10. The method of claim 1, wherein a portion of the first layout pattern is elongated and the dimensional quantity of the first layout pattern is a width of the elongated portion of the layout pattern.

11. The method of claim 1, wherein the first and second layout patterns are an integrated circuit layout pattern, a printed circuit board (PCB) layout pattern, or a field-programmable gate array (FPGA) layout pattern.

12. A method for manufacturing a semiconductor device, the method comprising:
    determining a distance between a first sub-pattern and a second sub-pattern of a layout pattern, wherein the first sub-pattern is associated with a first layer and has a first angle relative to grid lines of a minimum grid, wherein the second sub-pattern is associated with a second layer different from the first layer and has a second angle relative to the grid lines of the minimum grid, wherein the minimum grid is defined by a length, a first direction and a second direction orthogonal to the first direction, the distance comprising a first component associated with the first direction and a second component associated with the second direction,
    wherein the first component is a first even-integer multiple of the length and the second component is a second even-integer multiple of the length, wherein the first component is a projection of the distance to the first direction, and wherein the second component is a projection of the distance to the second direction.

13. The method of claim 12, wherein the distance is defined along the angle.

14. The method of claim 12, wherein the first sub-pattern and the second sub-pattern are substantially parallel to each other.

15. The method of claim 14, wherein the first integer multiple is an even integer multiple, and wherein the second integer multiple is an even integer multiple.

16. A method for manufacturing a semiconductor device, the method comprising:
    determining a first dimensional quantity of a first layout pattern having an angle relative to grid lines of a minimum grid defined by a first quantity associated with a first direction and a second quantity associated with a second direction perpendicular to the first direction based on the first quantity, the second quantity and the angle of the layout pattern relative to the grid lines of the minimum grid,
    wherein a portion of the first layout pattern is elongated and the first dimensional quantity of the first layout pattern is a width of the elongated portion of the layout pattern, wherein the first layout pattern is associated with a first layer and has a first angle relative to the grid lines of the minimum grid;
    determining a second dimensional quantity of a second layout pattern associated with a second layer different from the first layer, the second layout pattern having a second angle different from the first angle relative to the grid lines of the minimum grid;

determining a distance in the first direction between the first layout pattern and the second layout pattern based on an even-integer multiple of the first quantity; and determining a distance in the second direction between the first layout pattern and the second layout pattern based on an even-integer multiple of the second quantity.

17. The method of claim 16, wherein the first layout pattern is substantially rectangular or substantially L-shaped.

18. The method of claim 12, wherein the step of determining is performed such that said layout pattern is on-grid.

19. The method of claim 16, wherein each of the steps of determining is performed such that said layout pattern is on-grid.

20. The method of claim 16, wherein the first and second layout patterns are an integrated circuit layout pattern, a printed circuit board (PCB) layout pattern, or a field-programmable gate array (FPGA) layout pattern.

* * * * *